United States Patent
Dulman et al.

(10) Patent No.: US 7,086,031 B2
(45) Date of Patent: Aug. 1, 2006

(54) METHODS OF FORMING PATTERNED RETICLES

(75) Inventors: H. Daniel Dulman, Boise, ID (US); William A. Stanton, Boise, ID (US); John R. C. Futrell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 203 days.

(21) Appl. No.: 10/912,031

(22) Filed: Aug. 4, 2004

(65) Prior Publication Data

US 2005/0008951 A1   Jan. 13, 2005

Related U.S. Application Data

(62) Division of application No. 10/213,623, filed on Aug. 6, 2002, now Pat. No. 6,842,889.

(51) Int. Cl.
G06F 17/50 (2006.01)
G03F 9/00 (2006.01)

(52) U.S. Cl. .................. 716/19; 716/21; 430/5
(58) Field of Classification Search ............ 716/19–21; 430/5
See application file for complete search history.

(56) References Cited

U.S. PATENT DOCUMENTS

| | | | |
|---|---|---|---|
| 6,238,824 B1 | 5/2001 | Futrell et al. | |
| 6,284,443 B1 | 9/2001 | Anderson et al. | |
| 6,289,499 B1 | 9/2001 | Rieger et al. | |
| 6,425,117 B1 | 7/2002 | Pasch et al. | |
| 6,570,174 B1 | 5/2003 | Tounai et al. | |
| 6,687,895 B1 | 2/2004 | Zhang | |
| 6,902,854 B1 * | 6/2005 | Frankowsky | 430/30 |
| 2002/0007481 A1 | 1/2002 | Ono | |
| 2002/0047089 A1 | 4/2002 | Tounai et al. | |
| 2002/0158214 A1 | 10/2002 | Lin et al. | |
| 2003/0061592 A1 | 3/2003 | Agrawal et al. | |
| 2003/0118917 A1 * | 6/2003 | Zhang et al. | 430/5 |
| 2003/0211400 A1 | 11/2003 | Smith | |

* cited by examiner

*Primary Examiner*—Vuthe Siek
*Assistant Examiner*—Magid Y. Dimyan
(74) *Attorney, Agent, or Firm*—Wells St. John P.S.

(57) ABSTRACT

The invention includes methods of forming patterned reticles. Design features can be introduced into a layout for a reticle prior to optical proximity correction, and then removed prior to taping a pattern onto the reticle. Design features can alternatively, or additionally, be introduced after optical proximity correction and asymmetrically relative to one or more parts of a reticle pattern. The introduced features can subsequently be taped to the reticle as part of the formation of the patterned reticle.

11 Claims, 13 Drawing Sheets

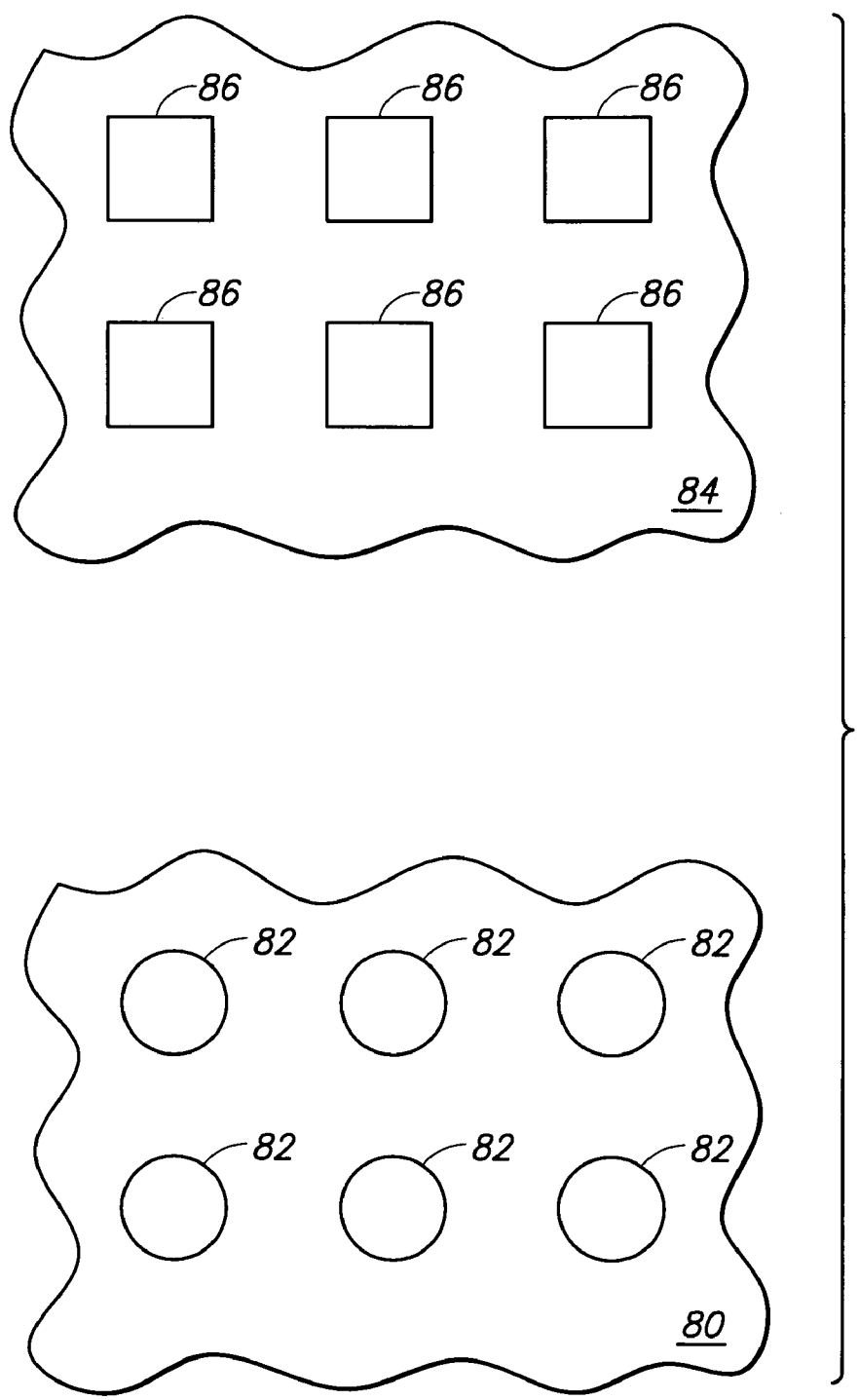

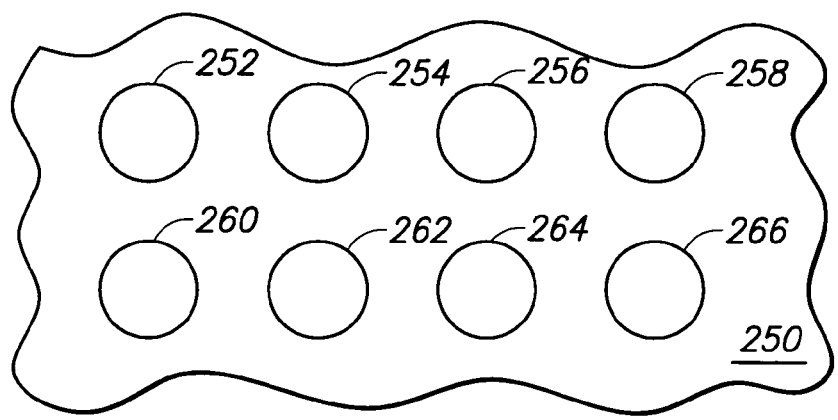
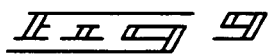
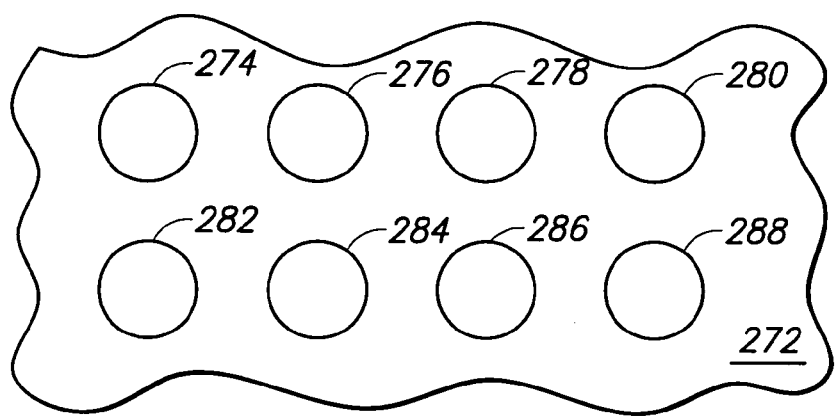
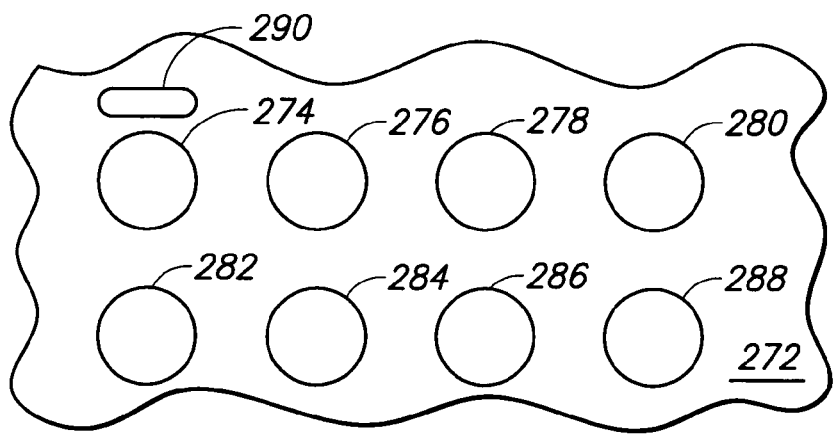

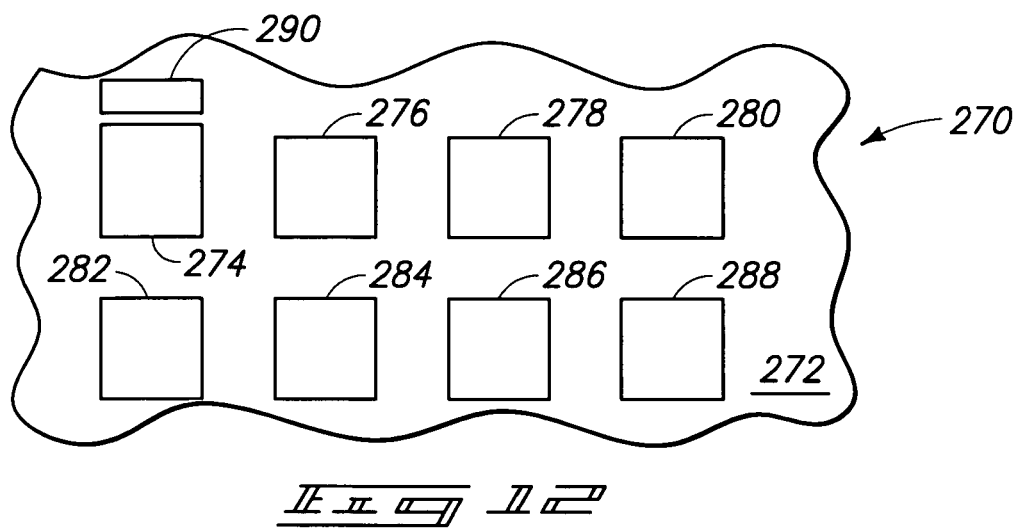
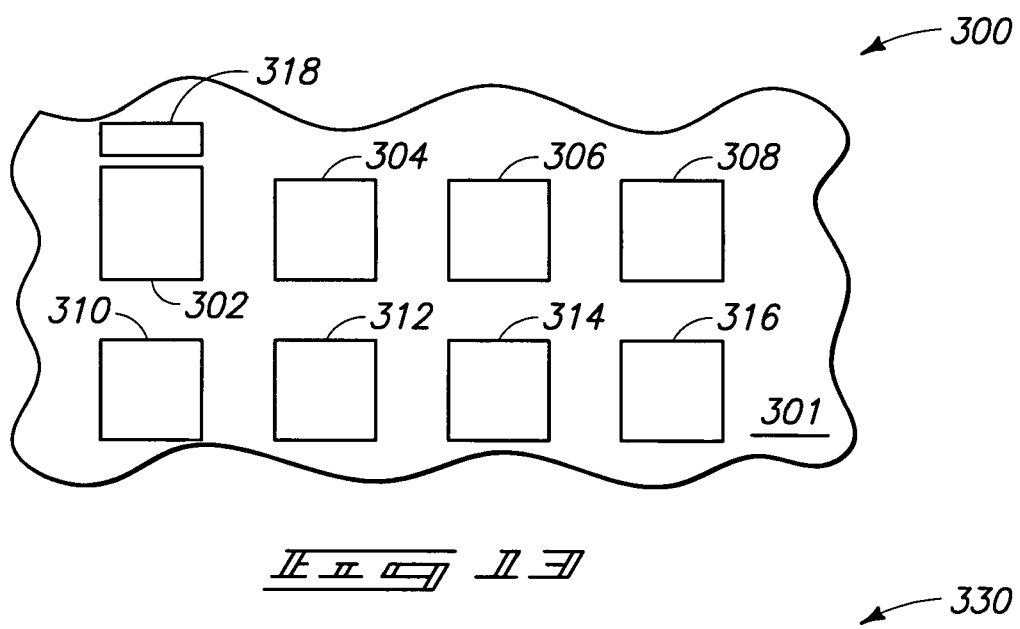
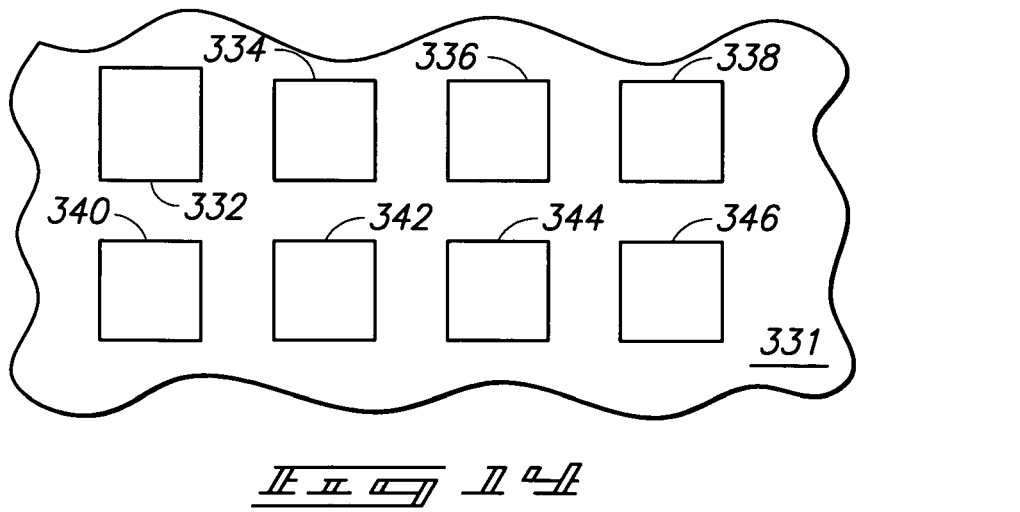

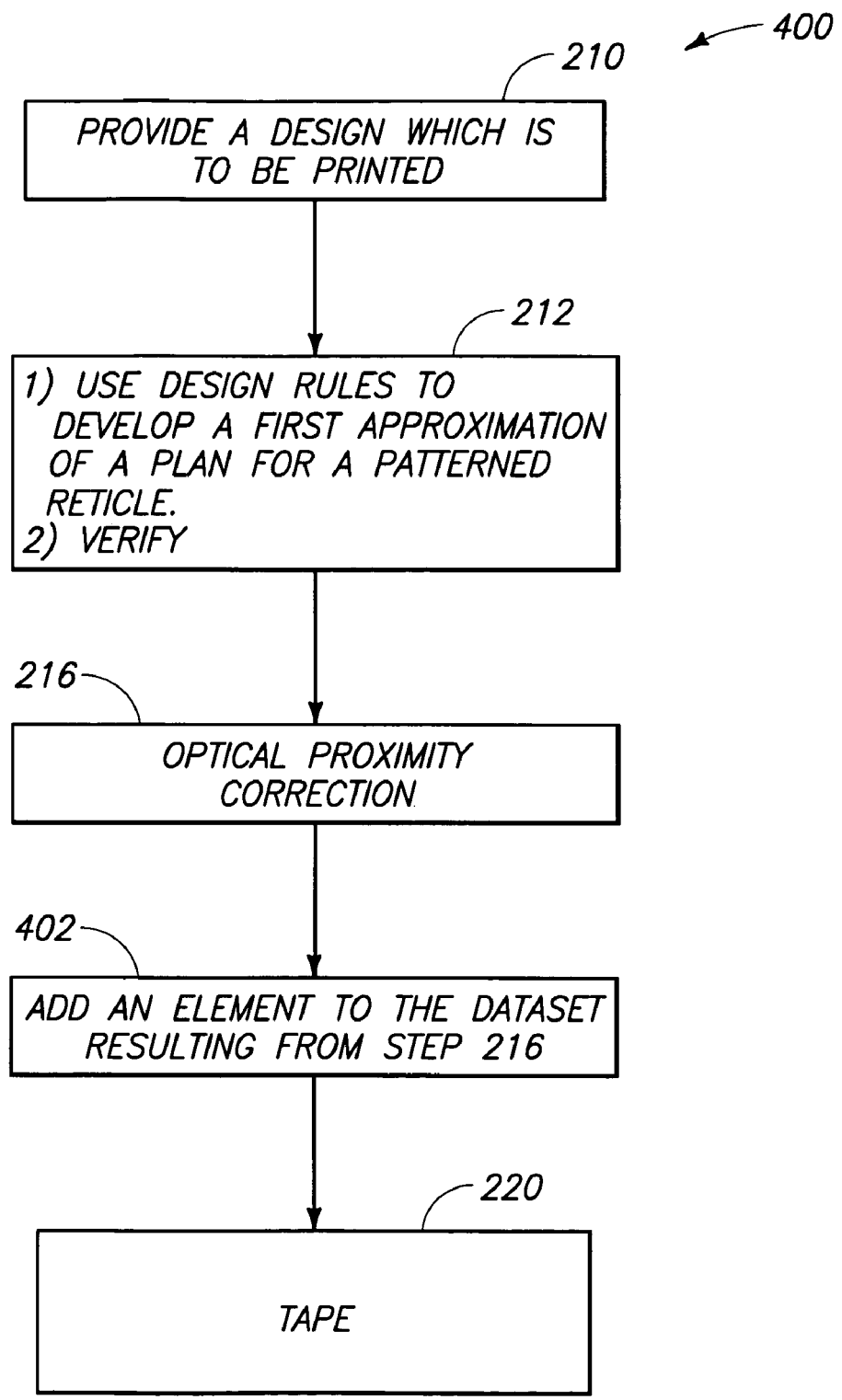

METHODS OF FORMING PATTERNED RETICLES

RELATED PATENT DATA

This patent resulted from a divisional application of U.S. patent application Ser. No. 10/213,623, which was filed Aug. 6, 2002 now U.S. Pat. No. 6,842,889.

TECHNICAL FIELD

The invention pertains to methods of forming reticles.

BACKGROUND OF THE INVENTION

Photolithography is commonly used during formation of integrated circuits on semiconductor wafers. More specifically, a form of radiant energy (such as, for example, ultraviolet light) is passed through a radiation patterning tool and onto a radiation-sensitive material (such as, for example, photoresist) associated with a semiconductor wafer. The radiation patterning tool can be referred to as a photomask or a reticle. The term "photomask" traditionally is understood to refer to masks which define a pattern for an entirety of a wafer, and the term "reticle" is traditionally understood to refer to a patterning tool which defines a pattern for only a portion of a wafer. However, the terms "photomask" (or more generally "mask") and "reticle" are frequently used interchangeably in modern parlance, so that either term can refer to a radiation patterning tool that encompasses either a portion or an entirety of a wafer. For purposes of interpreting this disclosure and the claims that follow, the term "reticle" is utilized generically to refer to any radiation patterning tool, inclusive of tools which define a pattern for only a portion of a wafer and tools which define a pattern for an entirety of a wafer.

Reticles contain light restrictive regions (for example, totally opaque or attenuated/half-toned regions) and light transmissive regions (for example, totally transparent regions) formed in a desired pattern. A grating pattern, for example, can be used to define parallel-spaced conductive lines on a semiconductor wafer. As discussed previously, the wafer is provided with a layer of radiation-sensitive material (such as, for example, photosensitive resist material, which is commonly referred to as photoresist). Radiation passes through the reticle onto the layer of photoresist and transfers a pattern defined by the radiation patterning tool onto the photoresist. The photoresist is then developed to remove either the exposed portions of photoresist for a positive photoresist or the unexposed portions of the photoresist for a negative photoresist. The remaining patterned photoresist can then be used as a mask on the wafer during a subsequent semiconductor fabrication step, such as, for example, ion implantation or etching relative to materials in the wafer proximate the photoresist.

Advances in semiconductor integrated circuit performance have typically been accompanied by a simultaneous decrease in integrated circuit device dimensions and a decrease in the dimensions of conductor elements which connect those integrated circuit devices. The demand for ever smaller integrated circuit devices brings with it demands for ever-decreasing dimensions of structural elements, and ever-increasing requirements for precision and accuracy in radiation patterning with reticles.

FIG. 1 shows a flow chart illustrating a typical process utilized for creating a pattern for a reticle. At an initial step 10, a preliminary design is created for the reticle and verified. The creation of the design begins with provision of a desired pattern which is ultimately to be formed in photoresist. Subsequently, the design is created for the reticle which will roughly produce the desired pattern on photoresist from radiation passed through the reticle. The design is rough in that it largely ignores effects of interference on radiation passing through the reticle.

After the design is believed to be complete, (i.e., once it is believed that all patterned features which are to be patterned in photoresist with the reticle are represented in the design) the design is submitted to a verification process to confirm that the design is complete.

After the design has been created and verified, it is subjected to optical proximity correction (shown as step 20 in FIG. 1). The optical proximity correction takes into account various interference factors that influence radiation passing through a reticle (i.e., constructive and destructive interference effects that result from passing radiation through patterns having dimensions on the same order as the wavelength of the radiation, or smaller). The optical proximity correction can be utilized to correct all parts of the design, or only some parts of the design. In other words, the optical proximity correction can be applied to only some portions of a design, while other portions are not optical proximity corrected. Typically there will be a verification step following the optical proximity correction.

The steps of generating a design from a desired pattern which is to be provided in photoresist, verification of the design, optical proximity correction, and verification of the correction, are typically accomplished primarily through the use of software. A suitable software package which can be utilized for one or more of the steps is HERCULES™/TAURUS OPC™, which is available from Avant! Corporation™.

The optical proximity correction creates a dataset which is subsequently translated into a pattern formed on a reticle. The process of translating the dataset into a pattern on the reticle is frequently referred to as taping the pattern onto the reticle. In such context, the terms "tape" and "tape out" refer to a process of transferring the dataset to appropriate hardware which writes a pattern represented by the dataset onto the reticle. The process of writing onto the reticle can be accomplished by, for example, laser writing and/or electron-beam writing methodologies. The step of taping the pattern onto the reticle is shown in FIG. 1 as step 30.

After the pattern has been formed on the reticle, the reticle can be utilized for patterning radiation in semiconductor fabrication processes. FIG. 2 illustrates an exemplary apparatus 40 in which a reticle is utilized for patterning radiation. Apparatus 40 comprises a lamp 42 which generates radiation 44. Apparatus 40 further comprises a reticle 46 through which radiation 44 is passed. A semiconductor substrate 48 having a radiation-sensitive material 50 thereover is illustrated associated with apparatus 40. The radiation passing through reticle 46 impacts radiation-sensitive material 50 to form a pattern within the radiation-sensitive material. The process of forming a pattern in a radiation-sensitive material with a reticle can be referred to as a printing operation. For purposes of interpreting this disclosure and the claims that follow, the term "taping" will refer to a process of forming a pattern on a reticle, and the term "printing" will refer to a process of forming a pattern on a radiation-sensitive material utilizing the reticle.

Reticle 46 typically comprises an opaque material (such as chrome) over a transparent material (such as a glass). Reticle 46 has a front side where the pattern is formed as features (or windows) extending through the opaque material, and has a back side in opposing relation to the front side. The shown reticle has two opposing sides 45 and 47, and in practice one of the two sides would be the front side (typically side 45) and the other would be the back side. In some applications features can be printed on both the front side and back side of the reticle.

As discussed above, reticle 46 will typically have a pattern with dimensions on the order of the wavelength of the radiation passing through the reticle, or smaller. Accordingly, various interference effects can occur as the radiation passes through the reticle so that the radiation exiting the reticle will transfer a pattern somewhat different than the pattern of the reticle. Such is illustrated diagrammatically in FIG. 3. Specifically, FIG. 3 illustrates an exemplary pattern 60, which can be desired to be formed in a radiation-sensitive material, and illustrates an approximation of a pattern 70 which would be formed in a reticle to generate the pattern 60. Pattern 70 is referred to as an approximation because the pattern is a qualitative representation of the type of pattern utilized in reticle for generating pattern 60, rather than a quantitative representation.

The FIG. 1 process can, for example, start with a pattern identical to pattern 60 being provided at the design step (10) of the reticle fabrication process, and such design would then be converted to the shape 70 during the optical proximity correction (20) step.

FIGS. 4 and 5 illustrate exemplary designs which can be desired to be formed in radiation-sensitive materials, and illustrate the reticle patterns commonly utilized to create such designs. Referring initially to FIG. 4, a radiation-sensitive material 80 is illustrated in top view, and a design is formed within the material comprising a plurality of features 82. The shown features 82 are circular in patterned dimension, and can be utilized, for example, in forming contact openings.

Features 82 can be desired to be identical in printed dimension relative to one another. The printed dimension of features 82 corresponds to the shape printed on a surface of radiation-sensitive material 80 during a photolithographic process (i.e., to a pattern of radiation formed on the surface of the radiation-sensitive material as the radiation passes through a reticle), as opposed to a depth of the features. The printed dimension is a circumference of the shown circular features.

FIG. 4 also illustrates a reticle substrate 84 comprising a pattern associated therewith which includes a plurality of identical elements 86. The elements 86 are in a one-to-one correspondence with the features 82 formed in the radiation-sensitive material. Further, each of elements 86 is approximately square in shape. In operation, radiation is passed through reticle 84 to form the pattern of printed images 82 on radiation-sensitive material 80. Regions 86 of the reticle can be either more transparent to radiation than surrounding regions of the reticle, or can be less transparent, depending on whether the radiation-sensitive material corresponds to a positive or negative material. If elements 86 are more transmissive to radiation than surrounding regions, the elements 86 can effectively be windows which allow radiation to pass through those specific regions of the reticle.

Referring to FIG. 5, a radiation-sensitive material 90 is illustrated in top view, together with a pattern comprising features 92 and 94 that is desired to be formed in the material. Feature 92 extends along a length 93, and feature 94 extends along a length 95. The lengths 93 and 95 are not parallel to one another in the shown embodiment, and in fact are substantially orthogonal to one another. Accordingly, features 92 and 94 can be considered to extend vertically and horizontally, respectively, relative to one another.

Features 92 and 94 can be desired to be identical in printed dimension relative to one another. The printed dimensions of features 92 and 94 correspond to the shapes printed on a surface of radiation-sensitive material 90 during a photolithographic process of forming features 92 and 94, as opposed to a depth of the features. The printed dimensions of the shown oblong features include length and width dimensions.

A reticle 96 is shown comprising a pair of elements 98 and 100. Reticle 96 can be utilized for generating the pattern associated with radiation-sensitive material 90. Specifically, the rectangular-shaped elements 98 and 100 can be utilized for forming the elongated shapes 92 and 94 as radiation is passed through reticle 96 and patterned with regions 98 and 100.

Various problems can occur in utilizing reticles to pattern radiation during a printing process. Such problems can include differing attributes of a radiation-sensitive material in different regions where features of a pattern are to be formed, and/or aberrations associated with radiation utilized during a printing process. An exemplary aberration associated with radiation can include astigmatism. In the exemplary processing described with reference to FIG. 5, it is desired that feature 92 and feature 94 be identical to one another (except that the features extend in different directions). However, if astigmatism occurs during the printing of features 92 and 94, such can cause different levels of exposure of the radiation-sensitive material associated with one feature relative to the exposure of the material associated with the other feature, which can cause the resulting features to be non-identical relative to one another.

FIG. 6 illustrates another aberration that can be associated with the radiation. Specifically, FIG. 6 illustrates a cross-sectional view of a fragment 105 of semiconductor construction during a printing process. The construction comprises a semiconductor substrate 110 having a layer 112 formed thereover.

In describing the various applications of the invention which follow, it is useful to utilize the term "substrate" to refer to various supporting structures, and combinations of supporting structures. Accordingly, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Layer 112 covers only a portion of the substrate. A radiation-sensitive material 114 extends over substrate 110 and layer 112. The radiation-sensitive material has a varying topography, and specifically has a lower surface over regions of substrate 110 that are not covered by layer 112, and a higher surface over the regions that are covered by layer 112.

Regions 116 and 118 are provided to diagrammatically illustrate areas where features are to be printed into material 114. The dashed lines of regions 116 and 118 are to be understood as locations relative to material 114, rather than as structures extending upwardly from material 114. The feature printed at location 116 will ideally be identical to the feature printed at location 118. However, such typically doesn't occur in practice.

Region 116 is associated with a lower portion of material 114 and region 118 is associated with a higher portion of the material. Radiation passing through the reticle should be focused at an upper surface of the material 114 that is to be patterned. However, since the upper surface of material 114 varies in height, the radiation cannot be simultaneously focused at both the location of feature 116 and the location of feature 118. Accordingly, the radiation is focused at an intermediate location, with a focal point of the radiation being illustrated diagrammatically by dashed line 120. Since the radiation is focused above the location of feature 116 and below the location of feature 118, there can be an image size difference at the location of feature 118 relative to the location of feature 116.

FIG. 7 illustrates various attributes that can be associated with a radiation-sensitive material. More specifically, FIG. 7 illustrates a fragment 125 comprising a semiconductor substrate 130, a layer 132 over a portion of the semiconductor substrate, and a radiation-sensitive material 134 formed over semiconductor substrate 130 and layer 132.

Radiation-sensitive material 134 comprises a thickness 135 which is substantially uniform over substrate 130 and layer 132, but which increases to a thickness 137 at a location where an elevational height of the material 134 changes due to layer 132. The change in thickness of material 134 can be considered a change in an attribute of the radiation-sensitive material, and such change can influence formation of a pattern within material 134.

A series of regions 136, 138, 140, 142, 144 and 146 are illustrated relative to material 134 where patterned features are to be formed within the material. It is noted that regions 136, 138, 140, 142, 144 and 146 are designated by dashed lines extending upwardly from region 134. The dashed lines are utilized to indicate where the regions will be formed relative to material 134 and not to indicate that any structures are extending above material 134. Each of regions 136, 138, 140, 142, 144 and 146 will ideally be identical to one another when the features are formed to extend through material 134. However, the varying topology of an upper surface of material 134 creates three regions (labeled as 129, 131 and 133) that ideally are separately analyzed relative to one another. Region 131 has thicker resist than the other regions; and regions 129 and 133 are optimized at different focal elevations relative to one another.

Since the resist is thicker under feature 140 than under the other features, the feature 140 will not be identical to the other features if subjected to identical processing as the other features. For instance, if feature 140 is printed to have an identical width as the other features, then the opening formed relative to feature 140 may actually be narrower at the base of the opening than are the openings formed relative to the other features.

Semiconductor wafers can have numerous regions where radiation-sensitive material has different attributes than other regions due to, for example, the topography of the material. Further, numerous aberrations can be present in light utilized for printing a pattern to photoresist. Presently, various defects introduced by aberrations in radiation and/or by differing attributes in radiation-sensitive material are frequently not addressed during a process of forming a reticle. However, as integrated circuit devices become smaller it becomes increasingly desirable to compensate for problems induced through aberrations in radiation or differing attributes of radiation-sensitive material. Accordingly, it would be desirable to develop methodologies for addressing such problems.

SUMMARY OF THE INVENTION

In one aspect, the invention encompasses a method of forming a patterned reticle in which design features are introduced into a layout for the reticle prior to optical proximity correction, and then removed prior to taping a pattern onto the reticle.

In one aspect, the invention encompasses a method in which a design which is ultimately to be printed in radiation-sensitive material comprises first and second features which are at different locations but otherwise desired to be identical in printed dimension to one another. A first set of design rules is utilized to develop a first approximation of a plan of a pattern for the reticle utilized to produce the design. The first approximation comprises first and second patterns corresponding to regions of the patterned reticle which are to be utilized for forming the first and second features, respectively, of the design. The first and second patterns are identical to one another. After the first set of design rules is utilized, the first pattern is altered relative to the second pattern. After the first pattern is altered, optical proximity correction is utilized to form a plan dataset for the reticle. The plan dataset is utilized either directly or with modification to tape an arrangement of relatively opaque regions and relatively transparent regions onto a reticle to form the patterned reticle. The patterned reticle ultimately produces the first and second features of the design more similar to one another than it would if identical first and second patterns had been utilized during the optical proximity correction.

In one aspect, the invention encompasses a method in which a design which is ultimately to be printed in radiation-sensitive material has at least two features which are at different locations but otherwise desired to be identical to one another. A set of design rules is utilized to develop an approximation of a patterned layout for a patterned reticle which will be utilized to produce the design. The approximation comprises a first set of layout elements corresponding to the at least two features. The first set of layout elements are substantially identical to one another. Optical proximity correction is performed on the first approximation of the patterned layout to form a second approximation of the patterned layout. The second approximation comprises a second set of layout elements which are derived from the first set of layout elements through the optical proximity correction. The layout elements within the second set are substantially identical to one another. Additional layout elements are added to the second approximation to form an adjusted second approximation of the patterned layout. The additional layout elements are asymmetric relative to the at least two features so that the layout elements corresponding to the at least two features within the adjusted proximation are not substantially identical to one another. The adjusted second approximation is utilized to tape a pattern onto a reticle to form the patterned reticle.

BRIEF DESCRIPTION OF THE DRAWINGS

Preferred embodiments of the invention are described below with reference to the following accompanying drawings.

FIG. 4 is a top view of a prior art pattern in a radiation-sensitive material, together with a top view of a prior art reticle which can be utilized for forming the pattern.

FIG. 9 is a diagrammatic view of a dataset that is utilized at an initial stage of forming a reticle in accordance with the method of FIG. 8. The dataset of FIG. 9 corresponds to an image that is desired to be printed in a radiation-sensitive material, and is illustrated as an image in a radiation-sensitive material.

FIG. 10 is a diagrammatic view of a dataset utilized for forming a reticle in accordance with the method of FIG. 8, and generated from the dataset of FIG. 9. The dataset of FIG. 10 corresponds to a first approximation of a pattern that would be formed in a reticle for producing the FIG. 9 dataset, and is illustrated as a pattern formed in a reticle.

FIG. 11 is a diagrammatic view of a dataset utilized for forming a reticle in accordance with the method of FIG. 8, and comprises a modification of the dataset of FIG. 10. The dataset of FIG. 11 corresponds to an approximation of a pattern that would be formed in a reticle for producing the FIG. 9 dataset, and is illustrated as a pattern formed in a reticle.

FIG. 12 is a diagrammatic view of a dataset utilized for forming a reticle in accordance with the method of FIG. 8, and comprises an optical proximity corrected dataset of FIG. 11. The dataset of FIG. 12 corresponds to an approximation of a pattern that would be formed in a reticle for producing the FIG. 9 dataset, and is illustrated as a pattern formed in a reticle.

FIG. 13 is a diagrammatic top view of a patterned reticle formed utilizing the dataset of FIG. 12 in accordance with an exemplary aspect of the invention.

FIG. 14 is a diagrammatic top view of a patterned reticle formed utilizing the dataset of FIG. 12 in accordance with an exemplary aspect of the invention which is different than the aspect described with reference to FIG. 13.

FIG. 15 is a flow-chart diagram of an exemplary method of the present invention.

DETAILED DESCRIPTION OF THE PREFERRED EMBODIMENTS

Figure 8:
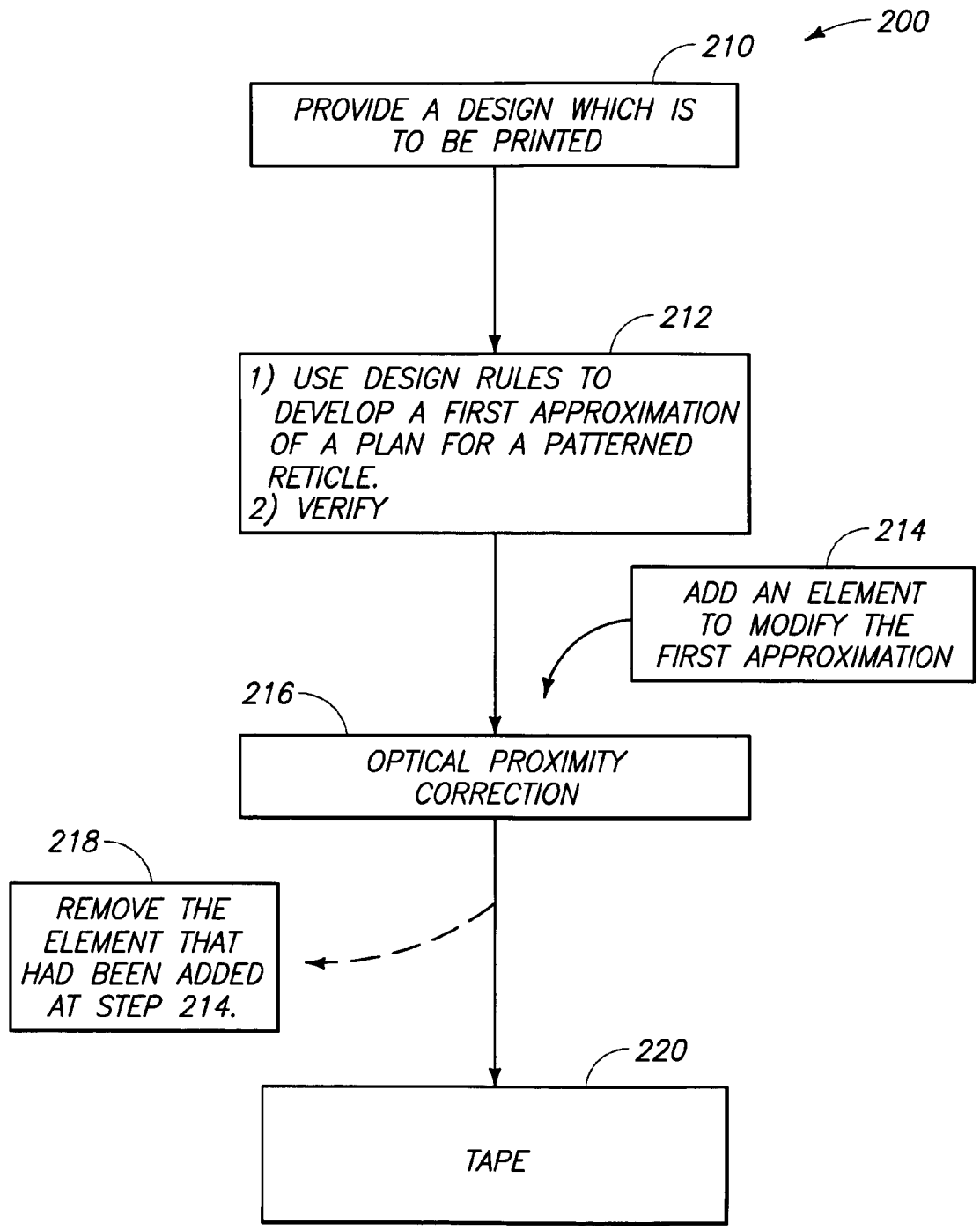
FIG. 8 is a flow chart diagram of an exemplary method of the present invention.

One aspect of the invention is described with reference to FIGS. 8–13. FIG. 8 shows a flow chart diagram 200 of an exemplary method of the present invention, and FIGS. 9–13 diagrammatically illustrate various processing stages of the FIG. 8 method for forming a patterned reticle.

At an initial stage 210 of the FIG. 8 method, a design is provided which is ultimately to be printed in a radiation-sensitive material utilizing radiation passing through the patterned reticle. FIG. 9 diagrammatically illustrates a dataset corresponding to a desired design (in other words, FIG. 9 corresponds to a desired end result). The design is shown within a radiation-sensitive material 250 for purposes of the illustration. The design includes a plurality of features 252, 254, 256, 258, 260, 262, 264 and 266 which are at different locations, but otherwise identical in printed dimension relative to one another. The shown features are circular regions patterned within radiation-sensitive material 250. It is noted that the material 250 of FIG. 9 would typically not actually exist. Rather, FIG. 9 corresponds to a model of a pattern which is ultimately desired to be formed from a patterned reticle created through the FIG. 8 method. In other words, the first step in forming a patterned reticle is to form a dataset model of the printed image which is desired to ultimately to be formed with the reticle.

It can be useful in describing the process of forming a reticle to identify two of the desired printed features as being first and second features, and to then compare differences in processing that occur relative to the features. For such purpose, feature 252 will be identified as a first desired printed feature, and feature 254 will be identified as a second desired printed feature.

Figure 5:
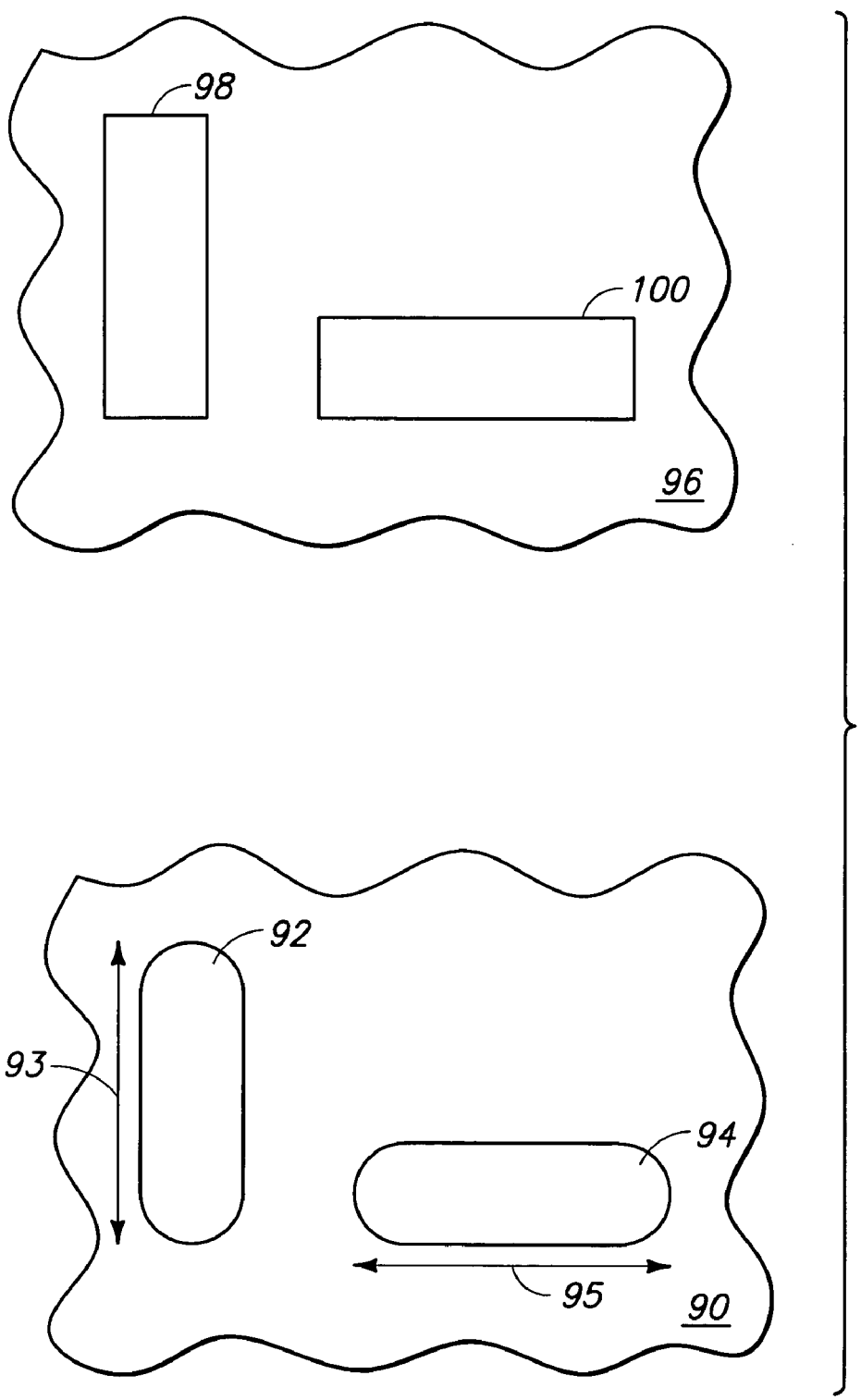
FIG. 5 is a top view of a prior art pattern in a radiation-sensitive material, together with a top view of a prior art reticle which can be utilized for forming the pattern.

It is noted that the layout of FIG. 9 is but one example of a desired printed image, and there are numerous other types of printed images which will have first and second features at different locations relative to one another but which are otherwise identical in printed dimension to one another. For instance, the prior art pattern shown in FIG. 5 comprises a pair of features 92 and 94 which are at different locations relative to one another, but which are otherwise desired to be identical in printed dimension.

At step 212 of the FIG. 8 method, design rules are utilized to develop a first approximation of a plan for the patterned reticle. The first approximation is then verified.

FIG. 10 shows a structure 270 corresponding to a reticle 272 having a pattern of features 274, 276, 278, 280, 282, 284, 286 and 288 formed therein. Features 274, 276, 278, 280, 282, 284, 286 and 288 correspond to patterns formed utilizing the first set of design rules. Although the features are shown as circles, it is to be understood that the features can have other shapes, such as, for example, polygonal shapes. Each of patterns 274, 276, 278, 280, 282, 284, 286 and 288 is identical to the other, and each of the patterns can be considered to correspond effectively to a window identical in dimension to the features 252, 254, 256, 258, 260, 262, 264, 266 desired to be formed in the radiation-sensitive material of FIG. 9. The structure 270 of FIG. 10 would not actually exist in practice, but rather is a model of a patterned reticle generated utilizing the first set of design rules. One aspect of the first set of design rules is that it typically ignores interference and diffraction effects on radiation passing through the reticle, and thus each of the patterns formed in structure 270 can be an exact complement of a desired feature which is to be formed with the pattern.

Figure 1:
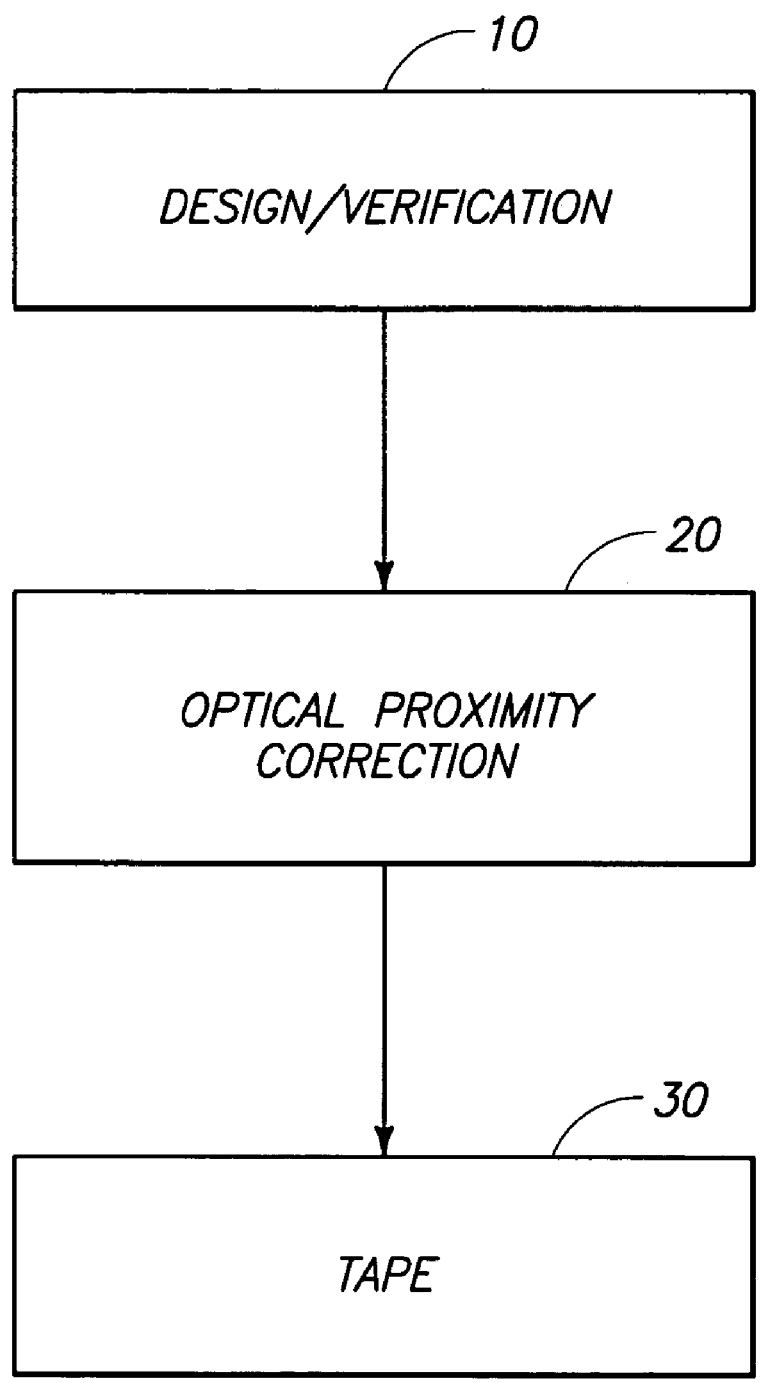
FIG. 1 is a flow chart diagram of a prior art method of forming a patterned reticle.
Figure 2:
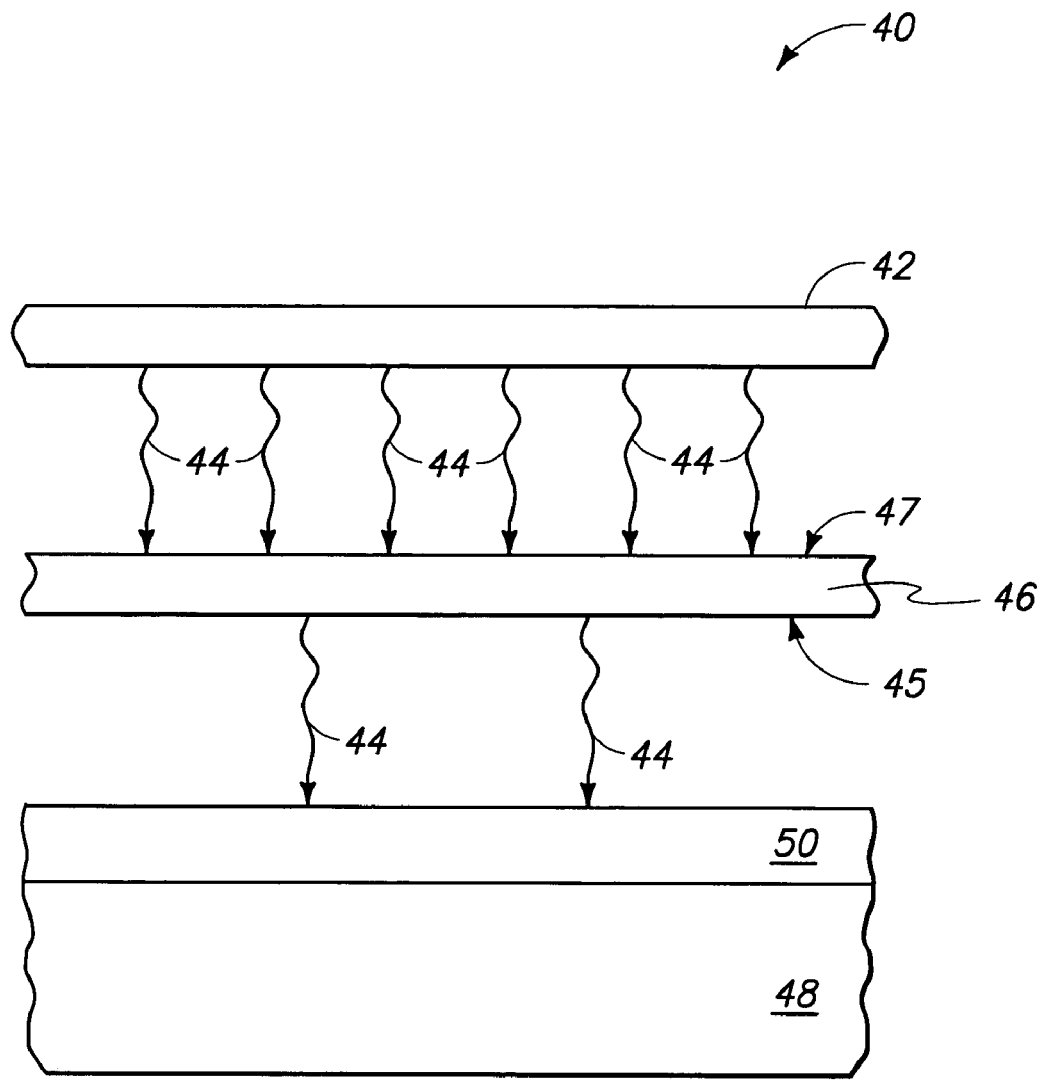
FIG. 2 is a diagrammatic, cross-sectional view of a prior art apparatus utilized in printing a pattern to a radiation-sensitive material utilizing a reticle.
Figure 3:
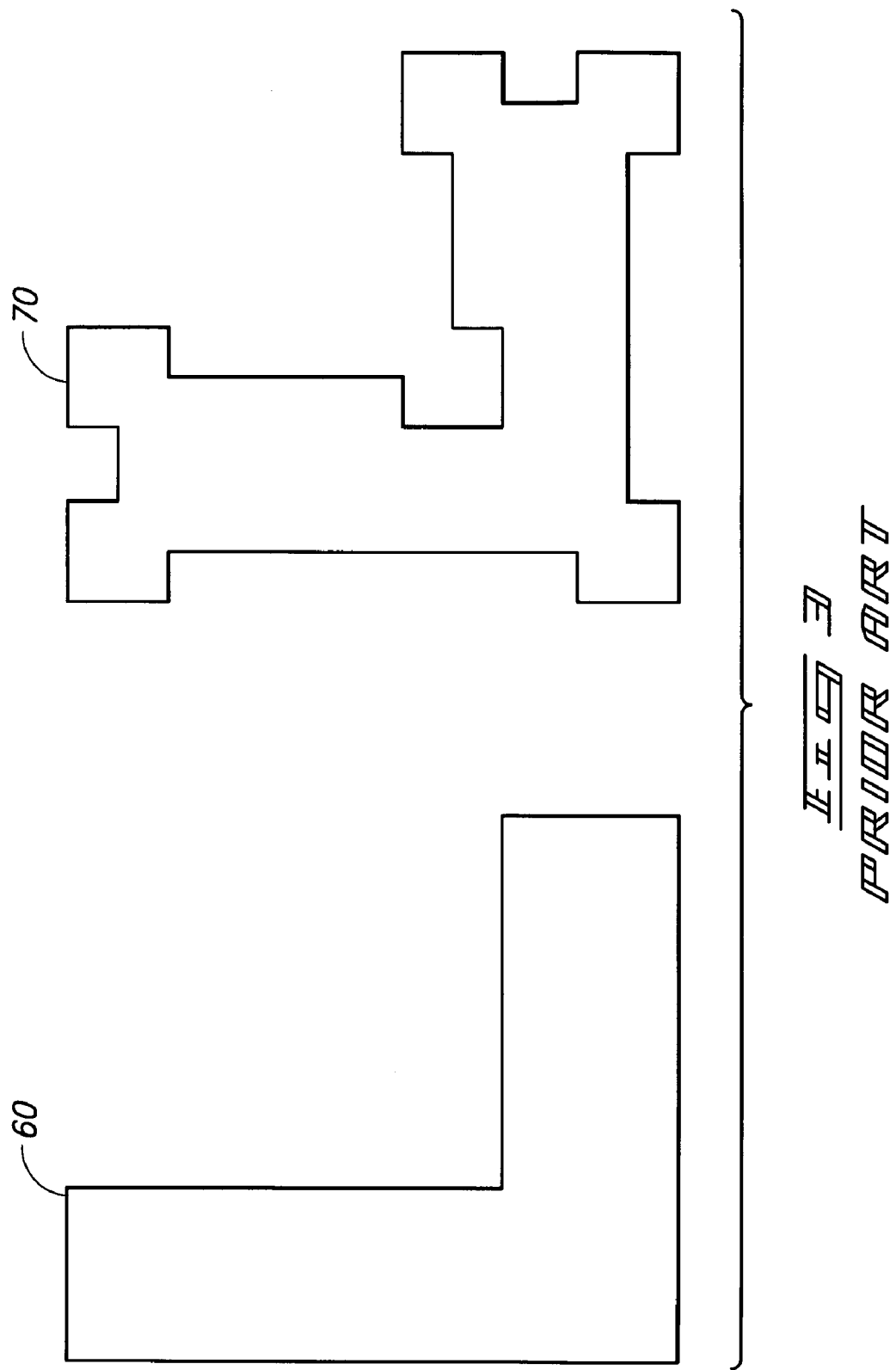
FIG. 3 is a diagrammatic view of a desired pattern and a reticle feature utilized for producing the pattern, in accordance with prior art methodologies.

The processing stage 212 of the FIG. 8 method can correspond identically to the processing stage 10 of the prior art method of FIG. 1, and can be accomplished utilizing suitable software. The dataset generated from the processing stage 212 can be considered a first approximation to a pattern that is ultimately to be formed in the patterned reticle.

Referring again to FIG. 8, a step 214 comprises adding at least one element to modify the first approximation from step 212. The addition of the at least one element in step 214 alters a design layout that had been developed utilizing the design rules at step 212, and can be considered an introduction of additional design features into the design layout generated at step 212.

FIG. 11 diagrammatically illustrates the addition of an element 290 relative to the patterns 274, 276, 278, 280, 282, 284, 286 and 288 of mathematical model 270. Element 290 is associated with pattern 274, and not with the other patterns 276, 278, 280, 282, 284, 286 and 288. Further, element 290 is preferably close enough to pattern 274 so that it affects the image formed by radiation passing through pattern 274. Such effect can result from interference of radiation passing through image 290 on radiation passing through pattern 274. Again, it is noted that structure 270 is a model, and accordingly element 290 and pattern 274 do not actually exist as a real structure, but instead exist only in the software utilized to ultimately develop a pattern which is to be written on a reticle. In the shown application of the invention, element 290 can be considered to be provided asymmetrically relative to patterns 274 and 276 as the element is provided proximate to pattern 274 and not pattern 276. Element 290 could also be provided symmetrically relative to the patterns.

In applications in which element 290 does not actually exist, substantial freedom can be utilized in mathematically providing element 290 within the structure 270. Specifically, element 290 can be modeled as having identical optical properties to pattern 274, or can be modeled to have different optical properties. In describing the possible differences between element 290 and pattern 274, it can be useful to describe pattern 274 as corresponding to a first pattern generated by design rules, and to describe the combination of pattern 274 and element 290 as corresponding to an alteration of the first pattern (or as an altered first pattern). The altered first pattern can then be considered to comprise an initial portion corresponding to 274 and an added element corresponding to the element 290. Element 290 can be laid separate from the real element, or abutting it, or overlapping it (in other words, superimposed over at least a portion of the real element). It is noted that although only one additional element is shown being added in the processing of FIG. 11, the invention encompasses other embodiments wherein multiple additional elements are added. Such multiple additional elements can be associated with a single one of the patterns 274, 276, 278, 280, 282, 284, 286 and 288; or can be associated with a plurality of such patterns.

Element 290 and pattern 274 can both be modeled as being transparent to radiation which will ultimately be utilized for printing a radiation-sensitive material (i.e., can be modeled as being not entirely opaque to the radiation). The relative transmission (transparency) of element 290 and pattern 274 can be treated as being identical, or can be treated as being different. Further, element 290 can be treated as inducing a different polarization to radiation passing therethrough relative to pattern 274. As another example, element 290 can be treated as inducing a different type of illumination to radiation passing therethrough relative to pattern 274. Such different illumination can correspond to, for example, quadrupole illumination or annular illumination. As another example, portion 290 can be treated as creating a different phase in radiation passing therethrough relative to pattern 274. The various mathematically modeled differences possible between element 290 and pattern 274 can be used alternatively to one another, or can, where appropriate, be combined. In particular applications, Zernicke coefficients can be utilized in the mathematical formulation of element 290. The examples provided above of properties of element 290 that can be varied are but a few of many possibilities. The various properties of element 290 that can be varied include, but are not limited to, physical dimensions (for example, size and form); optical parameters (for example, transmission, attenuation, phase shift, polarization [the light modeled to be transmitted through the element or attenuated by it can be modeled to be dependent on polarization]), wavelength dependence (the element can be modeled as a filter), aberrations, Zernicke numbers, defocus, numerical aperture, and spatial coherence/illumination type (for example, conventional, annular, quadrupole, dipole, or arbitrary source shape). The design features (i.e., element 290) can be modeled to form patterns in the reticle that vary non-linearly in one or more parameters (such as, for example, transmission and/or phase shift of light passing therethrough) relative to changes in one or both of the dose and intensity of the light. Various properties of the design features can be modeled as being a function of one or more of the three principal directions (i.e., the three principal axes x, y and z that are mutually orthogonal to one another) within the design features.

If element 290 is not printed in the reticle, it can be referred to as a pseudo-feature. Pseudo-features can be modeled to vary with location, for example due to expected differences in a topography of a substrate. But even if the topography is flat, multiple pseudo-features can be utilized which vary relative to one another to assist with, for example, field-dependent issues, such as aberrations, variations in exposure intensity and/or variations in exposure position. If three-dimensional modeling is utilized, one or more of the pseudo-features can be in the third ("z") direction. Another variation that can be incorporated into the pseudo-features is the side of the mask that the features are modeled to be on. The pseudo-features can be modeled to be on the same side of the photomask as the real features, and/or can be modeled to be on an opposite side of the mask (in other words, if the real features on a side of the mask defined as a front side, the pseudo-features can be modeled as being on a back side of the mask). Additionally, or alternatively, one or more of the pseudo-features can be modeled as being along neither the front side nor the back side, but instead as being at differing locations along a Z-axis extending through the photomask. In other words, one or more of the pseudo-features can be modeled to be at locations physically impossible for actual taped features, such as locations elevationally above the surface of the photomask, or locations within an interior of the photomask.

Figure 7:
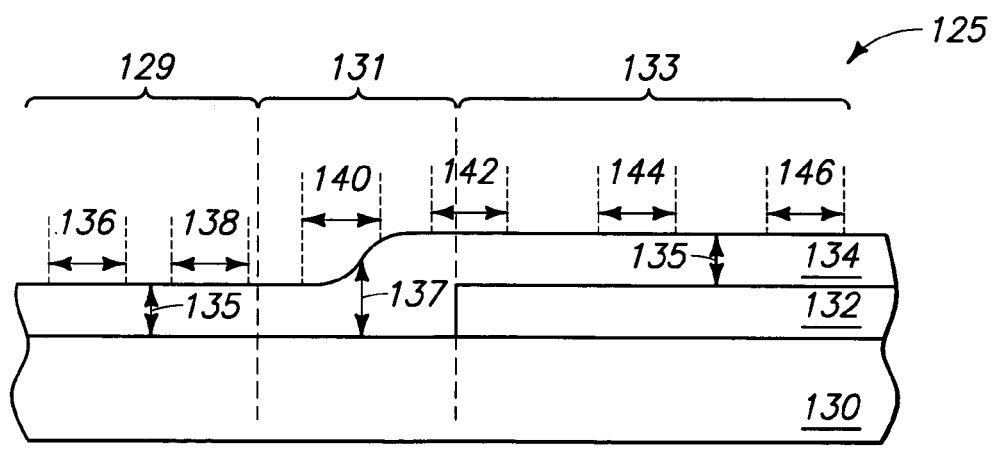
FIG. 7 is a diagrammatic, cross-sectional view of a fragment of a semiconductor construction illustrating another prior art printing process.

The additional elements added at the processing stages of FIG. 11 and step 214 of FIG. 8 can be utilized to compensate for problems expected to occur in specific locations of a printed radiation-sensitive material. Specifically, the elements can be utilized to compensate for regions of radiation-sensitive material having different attributes than others (exemplary different attributes are discussed above with reference to FIG. 7). If each of the first and second features 252 and 254 of the FIG. 9 printed pattern are to be identical to one another, but if the radiation-sensitive material 250 is expected to have a different attribute in the region of the first feature than in the second feature, then it can be desired to have the pattern 274 be different than the pattern 276. It will be difficult to compensate for all of the potentially different attributes of radiation-sensitive material at the processing stage where design rules are utilized to develop a first approximation of a plan for a patterned reticle (the first step of stage 212 of FIG. 8), in that all of the modifications would then be subject to a verification process. Numerous complexities would be introduced into a verification process if the various potential modifications to specific points of a pattern were introduced prior to verification. The methodology of FIG. 8 avoids introduction of such complexities by introducing the modifications after the verification of the initial design layout.

Figure 6:
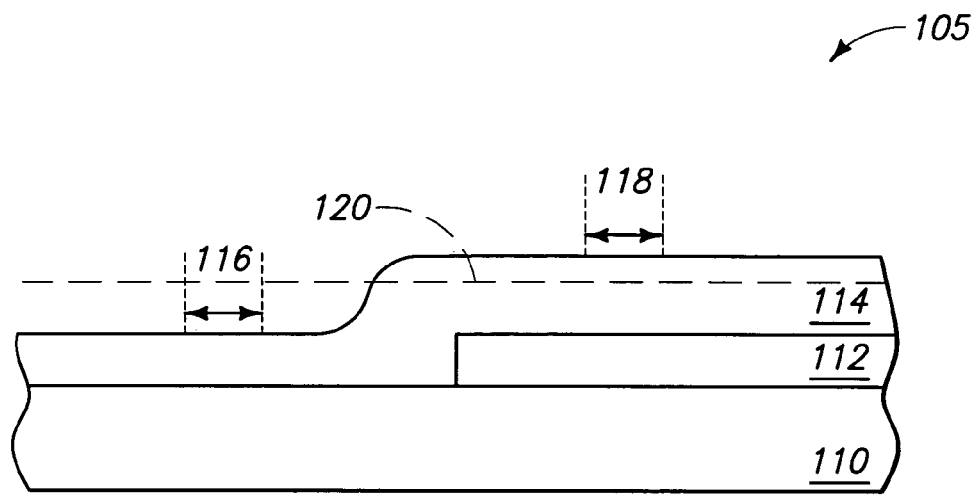
FIG. 6 is a diagrammatic, cross-sectional view of a fragment of a semiconductor construction illustrating a prior art printing process.

In addition, or alternatively, to correcting for different attributes of radiation-sensitive material, element 290 can be utilized to adjust for expected aberrations in radiation passing through a patterned reticle during a printing process. Accordingly, element 290 can be utilized to correct for, and in particular cases entirely compensate for, astigmatism and/or varying focal points occurring during a printing process. The problem of varying focal points was described previously with reference to FIG. 6.

Referring again to FIG. 8, a step 216 applies an optical proximity correction to the modified first approximation that resulted from step 214.

FIG. 12 illustrates mathematical model 270 after the optical proximity correction. The shapes of patterns 274, 276, 278, 280, 282, 284, 286 and 288 are changed to account for interference effects on radiation passing through the patterns. Further, the shape of element 290 has been altered, and element 290 has influenced the shape of pattern 274 relative to the other patterns so that pattern 274 now has a different shape than the other patterns. In the shown example, shape 274 is stretched into a rectangle. As discussed above, various differences between element 290 and pattern 274 can be modeled (with exemplary differences being different effects on the phase, polarization, illumination, attenuation and/or transmission of radiation). The optical proximity correction can be appropriately modified to treat element 290 differently than pattern 274 in accommodating the various different effects on radiation that can be modeled into element 290.

Although element 290 is shown separate from shape 274 after the optical proximity correction, it is to be understood that element 290 can also merge into pattern 274 to form a resulting pattern that is a combination of optically corrected pattern 274 and element 290. Also, although element 290 is shown to be altered by the optical proximity correction, it is to be understood that in other embodiments (not shown), the optical proximity correction could be utilized to alter one or more of patterns 274, 276, 278, 280, 282, 284, 286 and 288, while not altering element 290. In other words, the invention includes embodiments in which element 290 is not subjected to optical proximity correction even though various patterns are subjected to the optical proximity correction after provision of element 290.

The optical proximity correction forms a dataset of information. The dataset includes the portions of the modified first approximation that have been optical proximity corrected, as well as any portions of the modified first approximation that have not been optical proximity corrected during the correction of the other portions. FIG. 12 is a diagrammatic representation of the dataset. It should be understood that FIG. 12 is a representation of information that generally only exists mathematically during methodology of the present invention. The dataset resulting from the optical proximity correction can be referred to as a plan dataset, in that it corresponds to a plan that is ultimately to be utilized for taping a pattern onto a reticle. Alternatively, the dataset resulting from the optical proximity correction can be referred to as a pattern layout dataset, or as a second approximation of a pattern layout that is ultimately to be formed on a patterned reticle.

Referring again to FIG. 8, the dataset resulting from the optical proximity correction is utilized to tape a pattern onto a reticle. The taping can be accomplished utilizing, for example, e-beam or laser technologies as discussed above with reference to the prior art processing of FIG. 1. An optional step 218 (indicated with a dashed arrow to emphasize that the step is optional) is to remove the elements that had been provided at step 214 prior to the taping. If the elements have non-valid physical properties, they should be removed at this stage.

FIGS. 13 and 14 illustrate reticles 300 and 330 resulting from the taping of an optical proximity corrected dataset without removal of the additional elements utilized to modify a first approximation, and with removal of such additional elements, respectively. The reticles of FIGS. 13 and 14 comprise patterns of relatively transparent regions and relatively opaque regions. The terms "relatively transparent" and "relatively opaque" indicate that the regions are not necessarily entirely transparent or opaque, but rather are opaque and transparent relative to one another. Also, the phase of the different regions can be the same, or have different values. For instance the phase of radiation passing through an element can be modeled to be shifted 90° or 180° (or any other possible variation) relative to background and/or relative to one or more features and/or relative to one or more other elements.

Reticle 300 comprises a substrate 301 having patterns 302, 304, 306, 308, 310, 312, 314 and 316 extending therein. The patterns can be relatively transparent to a remainder of substrate 301, or vice versa. Patterns 302, 304, 306, 308, 310, 312, 314 and 316 correspond to the patterns 274, 276, 278, 280, 282, 284, 286 and 288, respectively, in the mathematical dataset of FIG. 12. Reticle 300 also comprises a pattern 318 corresponding to the element 290 of the mathematical dataset 270 of FIG. 12. Reticle 300 is an actual reticle which can ultimately be utilized to form a printed pattern corresponding to the desired pattern of FIG. 9.

The reticle 330 of FIG. 14 comprises a substrate 331 having patterns 332, 334, 336, 338, 340, 342, 344 and 346 extending therein. The patterns 332, 334, 336, 338, 340, 342, 344 and 346 correspond to the patterns 274, 276, 278, 280, 282, 284, 286 and 288 of the model 270 of FIG. 12. The reticle 330 of FIG. 14 does not comprise a pattern corresponding to the element 290 of the model 270, as such element was removed prior to taping of a pattern onto reticle 330.

Since element 290 was utilized only for modification of a printed pattern, and is not itself incorporated into the printed pattern, the shape and characteristics of the modeled element are effectively unlimited. Accordingly, a wide variety of modifications can be introduced with the element. In applications in which the element is introduced prior to optical proximity correction, and then removed prior to taping of a pattern onto a reticle, the element can be referred to as a pseudo-feature to indicate that the element never becomes a real feature in a taped reticle. It is noted that the element removed after the optical proximity correction may or may not be identical to the element introduced prior to the optical proximity correction. Specifically, the element removed after the optical proximity correction may be an optical proximity corrected version of the element that had been introduced prior to the correction, or may instead be identical to the element introduced. Unless specified in the claims that follow, the element removed from the optical proximity correction is to be understood to generically be either the optically corrected version of the element that had been introduced or the identical element that had been introduced.

The combined patterns 302 and 318 of reticle 300 (FIG. 13) can together correspond to a printed image forming the desired feature 252 of FIG. 9. Specifically, even though patterns 318 and 302 are separate from one another in the reticle, radiation passing through the patterns can interfere to form a single printed image, (also, it is noted that patterns 318 could be abutting one another or superimposed in other aspects of the invention). The combined patterns 302 and 318 of reticle 300 can compensate for differing attributes in a radiation-sensitive material, and/or for aberrations in radiation utilized during a printing process. Similarly, the pattern 322 of reticle 330 (FIG. 14) can compensate for variations in attributes of a radiation-sensitive material during a printing process, or for aberrations in radiation utilized during the printing process. As additional element 290 (FIG. 12) utilized to form the patterns of reticles 300 (FIG. 13) and 330 (FIG. 14) can be utilized to compensate for variations in attributes of radiation-sensitive material (or other variations, such as, for example, variations in a substrate underlying the radiation-sensitive material) and/or for aberrations in radiation (or other illumination irregularities, such as, for example, variations in dose with position), printed features formed utilizing the reticles 300 and 330 can be more similar to each other than they would be if the additional layout elements had not been present during the optical proximity correction. In other words, if features printed from patterns 302 and 304 of reticle 300 are desired to be identical to one another, the features can ultimately be printed to be more similar to one another utilizing the reticle 300 (in which patterns 302 and 304 are modified relative to one another to compensate for difficulties in a printing process) than they would be if a reticle were utilized in which patterns 302 and 304 were identical to one another.

Reticle 300 of FIG. 13 can be differentiated from reticle 330 of FIG. 14 based on whether the plan resulting from the optical proximity correction 216 of FIG. 8 is utilized directly (i.e., without modification) or is modified prior to taping a pattern onto a reticle. The reticle 300 of FIG. 13 results from utilizing the plan directly, and the reticle of FIG. 14 results from modification of the plan to remove the elements that had been provided at the step 214 of FIG. 8. Other modifications of the plan can be utilized either alternatively to the introduction of elements prior to an optical proximity correction, or additionally with introduction of elements prior to an optical proximity correction, in various aspects of the invention.

FIG. 15 illustrates a flow chart diagram 400 of an aspect of the invention in which a plan is modified by addition of an element after optical proximity correction. In referring to FIG. 15 identical numbering will be utilized as was used above in describing FIG. 8, where appropriate.

Flow chart 400 comprises the steps 210, 212, 216 and 220 of FIG. 8. Additionally, flow chart 400 contains a step 402 where at least one element is added to a dataset resulting from the optical proximity correction step 216. The at least one element is added before the taping of step 220, and accordingly is taped onto a reticle as part of an arrangement of relatively opaque and relatively transparent regions, with possibly different phases. The added element from step 402 influences a pattern of radiation formed by radiation passing through the patterned reticle. In particular aspects, the element added at step 402 can adjust for aberrations in radiation passing through the patterned reticle during a printing process, and/or for variations in the radiation-sensitive material exposed to the radiation passing through the reticle during the printing process.

The dataset resulting from the optical proximity correction of step 216 can be considered to define a set of layout elements which are ultimately to be taped to a reticle. Accordingly, the elements added at step 402 can be considered to be additional layout elements which are combined with the dataset resulting from the optical proximity correction prior to taping a pattern onto a reticle.

Figure 16:
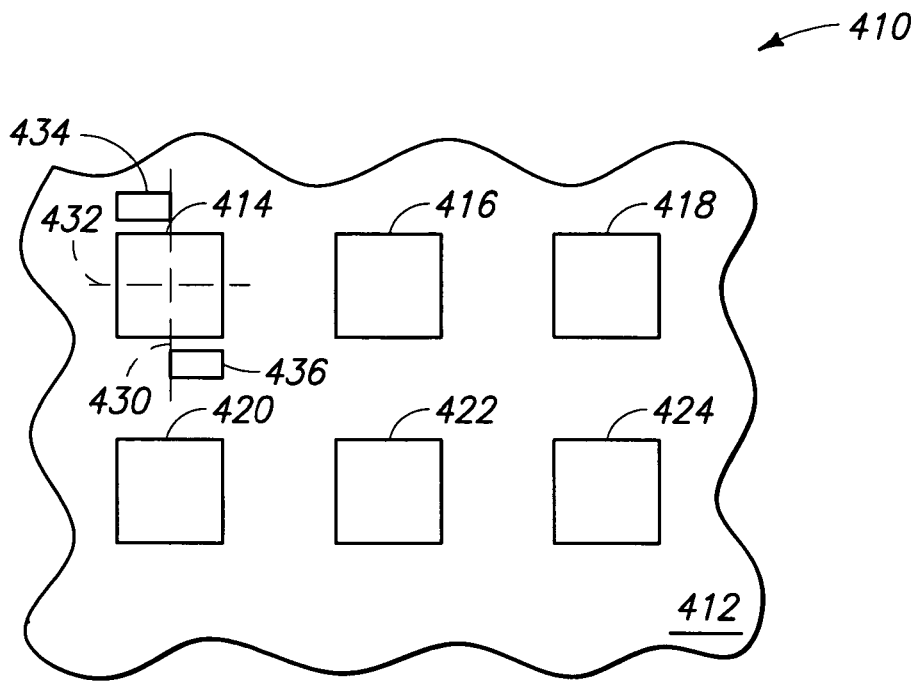
FIG. 16 is a diagrammatic top view of an exemplary reticle formed in accordance with methodology of the present invention.
Figure 17:
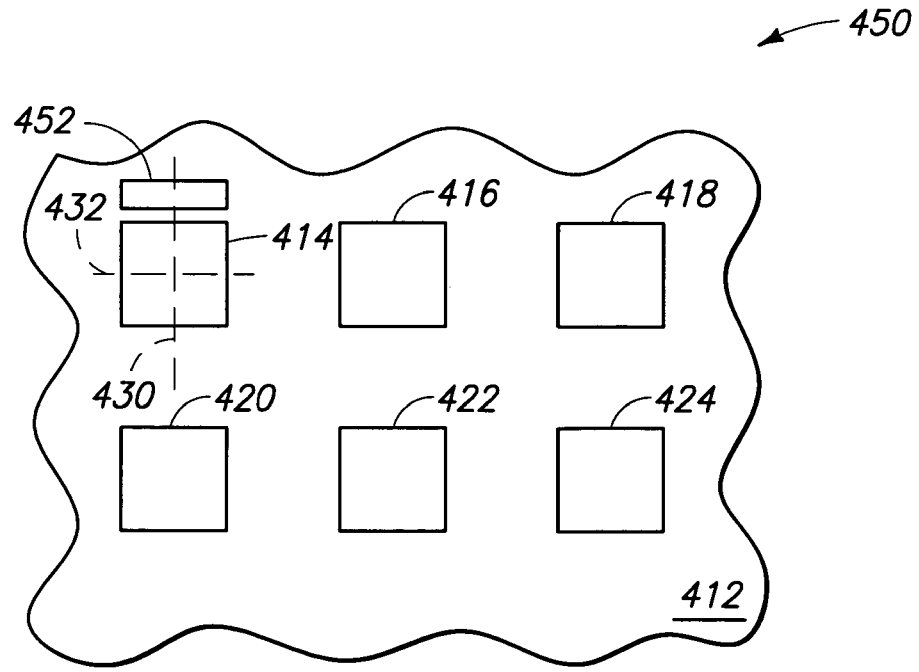
FIG. 17 is a diagrammatic top view of another exemplary reticle formed in accordance with methodology of the present invention.
Figure 18:
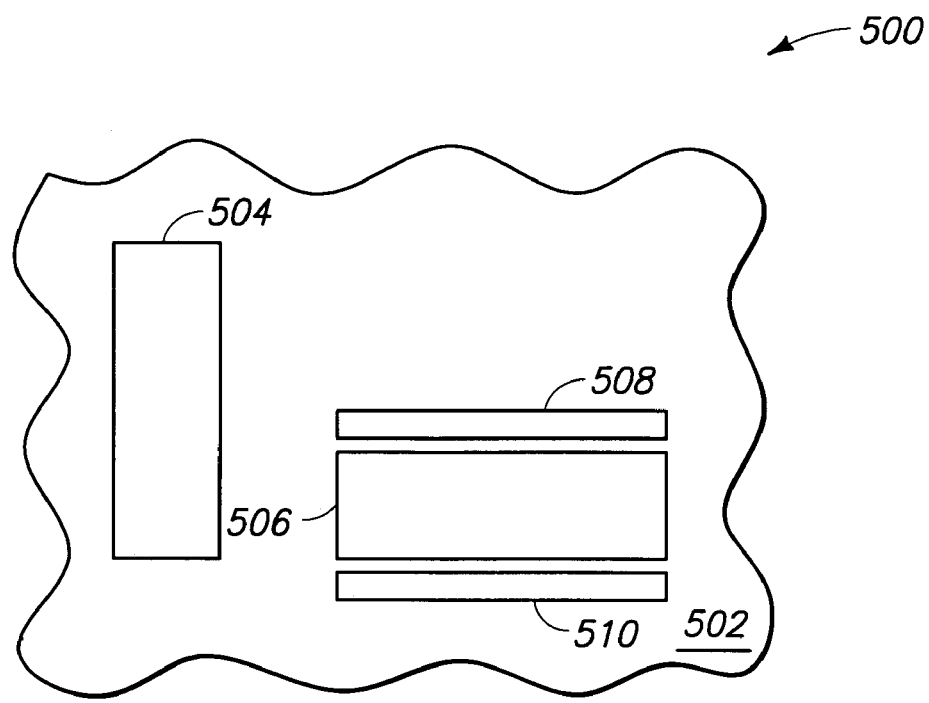
FIG. 18 is a diagrammatic top view of yet another exemplary reticle formed in accordance with methodology of the present invention.

The additional elements added at step 402 can be added with a defined symmetry relative to the initially present layout elements. FIGS. 16–18 illustrate various exemplary symmetries with which the additional elements can be added to the dataset resulting from optical proximity correction. Referring initially to FIG. 16, a structure 410 is illustrated comprising a substrate 412 and a plurality of identical patterns 414, 416, 418, 420, 422 and 424. Structure 410 corresponds to a model of a dataset resulting from optical proximity correction, and the patterns 414, 416, 418, 420, 422 and 424 correspond to elements defined by the dataset. It is to be understood that structure 410 is a diagrammatic representation of the dataset resulting from optical proximity correction, and is not a structure that would actually exist in a form other than a mathematical representation in methodology of the present invention. The patterns 414, 416, 418, 420, 422 and 424 are analogous to the patterns 86 described with reference to prior art FIG. 4. The patterns are polygons and approximately square (or in particular aspects can be exactly square to within errors of measurement), and accordingly each has four prominent sides of about equal length, (or in particular aspects the sides can be of exact equal length relative to one another within errors of measurement). Patterns 414, 416, 418, 420, 422 and 424 can be referred to as principal elements of an approximation dataset resulting from optical proximity correction. The patterns are referred to as "principal elements" to distinguish them from elements which do not directly correlate with structures ultimately formed in a patterned reticle generated from the dataset.

The approximately square patterns 414, 416, 418, 420, 422 and 424 have planes of symmetry extending therethrough, with a pair of planes of symmetry associated with pattern 414 being identified with dashed lines 430 and 432. A pair of additional layout elements 434 and 436 are added proximate pattern 414. The additional layout elements are close enough to pattern 414 so that if patterns 414, 434 and 436 are all taped onto a reticle, the taped regions from patterns 434 and 436 will not generate separate printed images but will instead influence the printed image generated from the taped region corresponding to pattern 414. Regions 434 and 436 are asymmetric relative to the planes of symmetry 430 and 432. An advantage of utilizing asymmetric regions is that such can enable compensation for asymmetric effects on a printing process. Asymmetric effects can include, for example, asymmetric variations within a radiation-sensitive layer, and asymmetric aberrations within a light source (with an exemplary asymmetric variation being astigmatism). The additional layout elements 434 and 436 can be generated and described utilizing any appropriate mathematical representation. In particular applications, Zernicke coefficients can be utilized in the mathematical formulation of elements 434 and 436.

FIG. 17 illustrates a structure 450 similar to the structure 410 described previously with reference to FIG. 16. Structure 450 corresponds to a representation of a dataset comprising layout elements from optical proximity correction step 216 of FIG. 15 in combination with an additional element 452. The elements resulting from the optical proximity correction are identified as patterns 414, 416, 418, 420, 422 and 424, as was done above with reference to FIG. 16. Element 414 is shown with a pair of planes of symmetry 432 and 430 relating to the element. The element 414 is approximately square, and accordingly has four prominent sides of about equal length. The additional layout element 452 is shown provided along less than all four of the prominent sides, and in the specifically is shown provided along only one of the four prominent sides. Element 452 is preferably close enough to pattern 414 so that when taped features corresponding to pattern 414 and 452 are formed in a reticle and utilized for a printing operation, the feature corresponding to pattern 452 does not print a separate and distinct image but instead modifies an image printed from the feature corresponding to pattern 414. Although the element is shown provided asymmetrically, it is to be understood that elements could also be provided symmetrically (such as, for example, around all four sides of the polygonal feature).

FIG. 18 shows a structure 500 illustrating another aspect of the method of FIG. 15. Structure 500 comprises a substrate 502 having principal pattern elements 504 and 506 extending therein. Structure 500 is a representation of a dataset that would exist after the optical proximity correction step 216 of FIG. 15, and after the additional element is added at step 402. The dataset represented by structure 500 can ultimately be sent to an appropriate apparatus for taping a reticle and thereby forming a pattern on the reticle comprising an arrangement of relatively transparent regions and relatively opaque regions. The principal elements 504 and 506 of structure 500 are similar to the elements 98 and 100 described with reference to prior art FIG. 5. Elements 504 and 506 can be identical to one another, and can correspond to a pair of features (such as, for example, the features 92 and 94 of prior art FIG. 5) which are desired to be printed in different locations of a radiation-sensitive material but to be otherwise identical to one another. Elements 504 and 506 can be referred to as layout elements which correspond to the features which are ultimately to be printed. Although the two elements are shown extending along principal directions that are approximately orthogonal to one another, it is to be understood that any of the numerous other possible arrangements of the two elements can be utilized. For instance, the two elements can extend along principal directions that are approximately parallel to one another or diagonal to one another.

Layout elements 504 and 506 are approximately rectangular, and in particular aspects can be exactly rectangular to within errors of measurement. Each of layout elements 504 and 506 has four prominent sides of which two are longer than the others.

A pair of additional layout elements 508 and 510 have been formed relative to principal element 506, and not relative to principal element 504. The additional layout elements are only along the longer of the prominent sides of layout element 506 in the shown aspect of the invention. It is to be understood, however, that the additional layout elements could also be, and/or alternatively be, provided along one or both of the shorter sides of rectangular element 506. In the shown embodiment, additional layout elements 508 and 510 are formed along both of the longer sides of rectangular element 506, but it is to be understood that the invention encompasses other embodiments in which layout elements are provided along only one of the longer sides of a rectangular principal element, or all around the principal element.

The additional layout elements 508 and 510 are preferably provided close enough to principal element 506 so that taped patterns resulting from elements 508 and 510 will not ultimately print separate and discrete features on a radiation-sensitive material, but rather will modify an image printed from a taped pattern corresponding to element 506. Since elements 506, 508 and 510 together define a common image formed during a printing process (rather than discrete images) the elements 506, 508 and 510 can together be considered to correspond to the printed feature. Accordingly, whereas the pattern resulting after optical proximity correction had a pair of principal elements (504 and 506) which were identical to one another, and which corresponded to features desired to print identically to one another; methodology of the present invention has asymmetrically modified the elements corresponding to the desired identical features. Specifically, one of the elements (504) is not modified, and the other element (506) is modified by combining additional elements 508 and 510 with the element 506 to alter an image printed by element 506. Preferably, the asymmetric alteration of the horizontally-extending element 506 relative to the vertically-extending element 504 causes features printed from the elements to be more similar to one another that the features would be in the absence of the asymmetric modification. The improved similarity can occur as a result of the asymmetric modification compensating for asymmetric influences that occur during a printing process. For instance, the asymmetric modification can compensate for various asymmetric influences on radiation utilized during a printing process (such as, for example, astigmatism and asymmetric depth of focus), and can compensate for asymmetric variations in a radiation-sensitive material during a printing process. Although the described improvement in similarity is achieved through utilization of the elements in an asymmetric modification, it should be understood that in some situations the improvement in similarity can be achieved through utilization of the elements in a symmetric modification.

Figure 19:
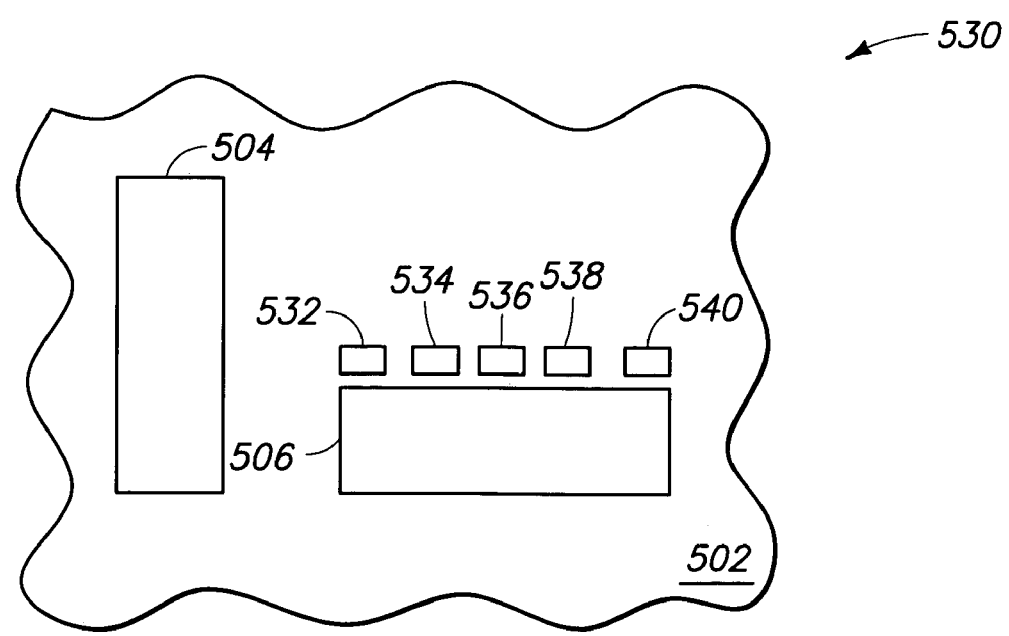
FIG. 19 is a diagrammatic top view of yet another exemplary reticle formed in accordance with methodology of the present invention.

FIG. 19 illustrates a structure 530 similar to the structure 500 discussed above with reference to FIG. 18. Structure 530 is a model of a dataset, and comprises a substrate 502 having elements 504 and 506 associated therewith. Structure 530 also comprises additional elements 532, 534, 536, 538 and 540 extending proximate one of the long sides of substantially rectangular principal element 506. Structure 530 is shown at a processing stage in which additional elements are added to a dataset resulting from optical proximity correction (a processing stage after step 402 of FIG. 15), but prior to taping a pattern defined by the dataset onto a reticle. The additional elements 532, 534, 536, 538 and 540 are provided relative to principal element 506 but not relative to principal element 504, or in other words are provided asymmetrically relative to the elements 506 and 504. The additional elements 532, 534, 536, 538 and 540 can be utilized similarly to the elements 508 and 510 described with reference to FIG. 18 for compensating for asymmetric effects occurring during a printing process.

The additional elements shown in FIGS. 18 and 19 can be provided with identical radiation-influencing characteristics as the principal elements. Accordingly, the additional elements can be taped to a reticle to form regions having the same effect on transmission and phase, for example, as do taped regions corresponding to patterns 504 and 506. Alternatively, one or more of the additional elements can be utilized to tape a region onto a reticle which will have a different effect on radiation than do regions 504 and 506, such as, for example, a different transmission relative to the radiation, or a different effect on phase of radiation passing through the region.

Figure 20:
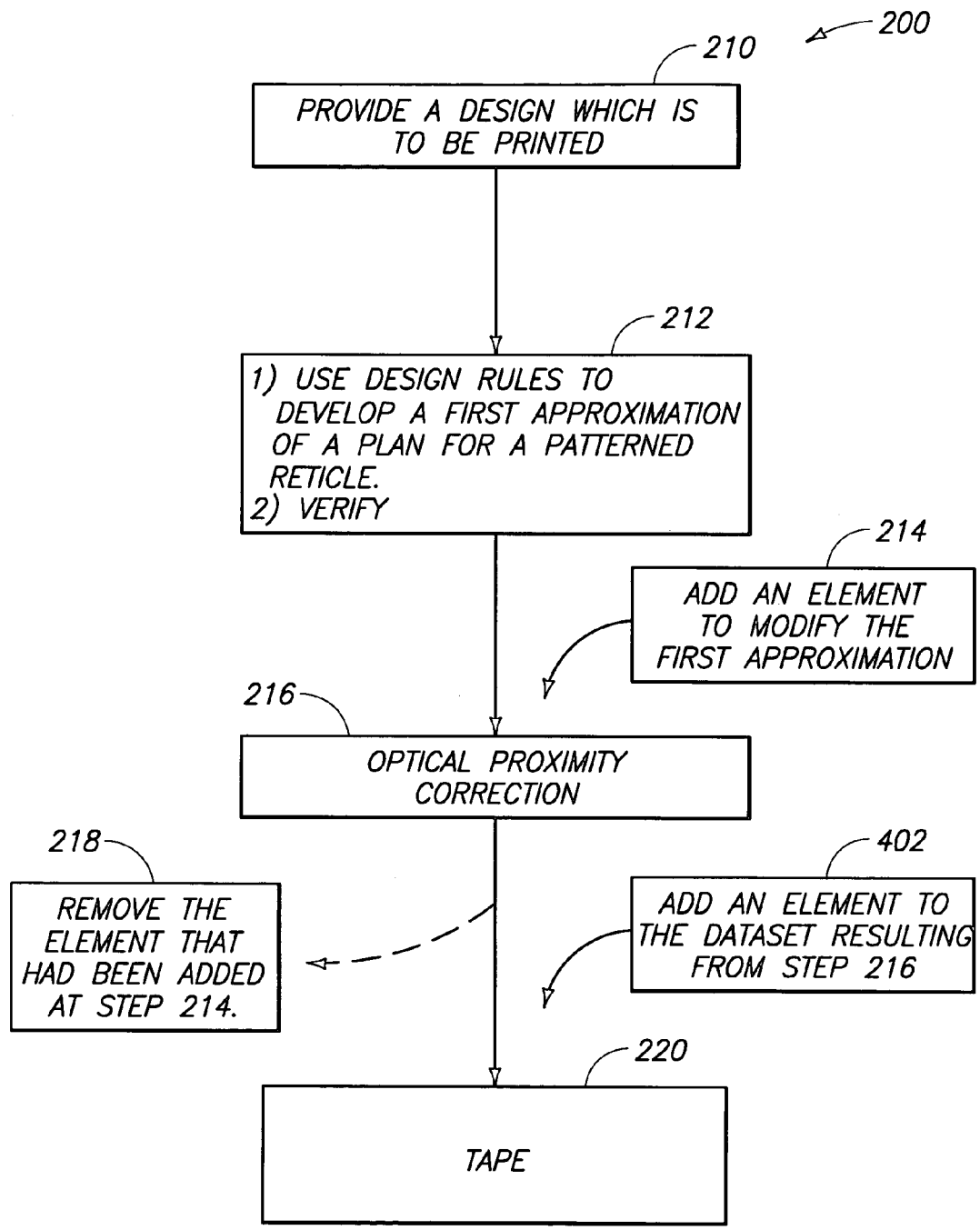
FIG. 20 is a flow chart diagram of an exemplary method of the present invention.

The methods described with reference to the flow charts of FIGS. 8 and 15 can be combined. FIG. 20 shows a flow chart 600 illustrating a combination of processing steps from the methods of FIGS. 8 and 15. The various process steps of FIG. 20 are labeled with identical numbering as was utilized above with reference to FIGS. 8 and 15.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a patterned reticle, comprising:
   providing a design which is ultimately to be printed in radiation-sensitive material utilizing the patterned reticle, the design having at least two features which are at different locations but otherwise desired to be identical to one another;
   utilizing a set of design rules to develop a first approximation of a pattern layout for the patterned reticle; the first approximation comprising a first set of layout elements corresponding to the at least two features; the first set of layout elements being substantially identical to one another;
   performing an optical proximity correction on the first approximation of the pattern layout to form a second approximation of the pattern layout, the second approximation comprising a second set of layout elements which are derived from the first set of layout elements through the optical proximity correction, the layout elements within the second set being substantially identical to one another;
   adding additional layout elements to the second approximation to form an adjusted second approximation of the pattern layout, the additional layout elements being asymmetric relative to the at least two features so that the layout elements corresponding to the at least two features within the adjusted approximation are not substantially identical to one another; and
   utilizing the adjusted second approximation to tape a pattern onto a reticle to form the patterned reticle.

2. The method of claim 1 wherein:
   the layout elements within the second set corresponding to the at least two features are approximately square elements which accordingly have four prominent sides of about equal length as one another; a first of the approximately square elements corresponding to a first of the at least two features and a second of the approximately square elements corresponding to a second of the at least two features; and
   wherein the additional layout elements are provided proximate only the first of the first and second approximately square elements; the additional layout elements altering a pattern of radiation corresponding to said one of the at least two features.

3. The method of claim 2 wherein the additional layout elements are provided along all four sides of said first of the approximately square elements.

4. The method of claim 2 wherein the additional layout elements are provided along fewer than all four sides of said first of the approximately square elements.

5. The method of claim 1 wherein:
   the layout elements within the second set corresponding to the at least two features are approximately rectangular elements which accordingly have four prominent sides, with two of the prominent sides being longer than the other two of the prominent sides; a first of the approximately rectangular elements corresponding to a first of the at least two features and a second of the approximately rectangular elements corresponding to a second of the at least two features; and
   wherein the additional layout elements are provided proximate only the first of the first and second approximately rectangular elements; the additional layout elements altering a pattern of radiation corresponding to said one of the at least two features.

6. The method of claim 5 wherein the first and second features extend along first and second lengths, respectively; wherein the first and second lengths are not parallel to one another; and wherein the additional layout elements compensate for astigmatism in radiation passing through the patterned reticle during printing of the first and second features.

7. The method of claim 1 wherein one of the at least two features is a first feature and another of the at least two features is a second feature; wherein the first and second features extend through regions of the radiation-sensitive material having different attributes relative to one another; and wherein the additional layout elements compensate for the differing attributes of radiation-sensitive material that said first and second features will extend through.

8. The method of claim 1 wherein one of the at least two features is a first feature and another of the at least two features is a second feature; wherein the first and second features extend through different thickness regions of the radiation-sensitive material relative to one another; and wherein the additional layout elements compensate for the differing thicknesses of radiation-sensitive material that said first and second features will extend through.

9. The method of claim 1 wherein the radiation ultimately passing through the patterned reticle is expected to have an aberration; and wherein the additional layout elements compensate for the expected aberration.

10. The method of claim 1 wherein the radiation ultimately passing through the patterned reticle will have astigmatism; and wherein the additional layout elements compensate for the astigmatism.

11. The method of claim 1 wherein the radiation ultimately passing through the patterned reticle will have varying focal points; and wherein the additional layout elements compensate for the varying focal points.

* * * * *

UNITED STATES PATENT AND TRADEMARK OFFICE
CERTIFICATE OF CORRECTION

PATENT NO. : 7,086,031 B2  
APPLICATION NO. : 10/912031  
DATED : August 1, 2006  
INVENTOR(S) : H. Daniel Dulman It is certified that error appears in the above-identified patent and that said Letters Patent is hereby corrected as shown below:

Col. 8, line 27 –  
 Replace "ultimately to be formed with the reticle"  
 With --ultimately be formed with the reticle--

Col. 14, lines 65-66 –  
 Replace "In particular applications. Zernicke coefficients can be utilized in the"  
 With --In particular applications, Zernicke coefficients can be utilized in the--

Col. 15, line 14 –  
 Replace "sides, and in the specifically is shown provided along only"  
 With --sides, and specifically is shown provided along only --

Col. 16, line 27 –  
 Replace "from the elements to be more similar to one another that the"  
 With --from the elements to be more similar to one another than the--

Signed and Sealed this

Twenty-second Day of May, 2007

JON W. DUDAS  
*Director of the United States Patent and Trademark Office*